United States Patent [19]

Downs et al.

[11] Patent Number: 5,394,367
[45] Date of Patent: Feb. 28, 1995

[54] SYSTEM AND METHOD FOR WRITE-PROTECTING PREDETERMINED PORTIONS OF A MEMORY ARRAY

[75] Inventors: Jeffery E. Downs; Michael W. Yeager, both of Colorado Springs, Colo.

[73] Assignee: Ramtron International Corporation, Colorado Springs, Colo.

[21] Appl. No.: 210,699

[22] Filed: Mar. 18, 1994

[51] Int. Cl.⁶ ........................ G11C 7/00; G11C 11/22
[52] U.S. Cl. ............... 365/195; 365/189.07; 365/145; 365/189.01; 342/51
[58] Field of Search ............... 365/195, 189.07, 145, 365/185, 189.01, 230.01; 342/51

[56] References Cited

U.S. PATENT DOCUMENTS 4,958,323  9/1990  Sugawara et al. ............ 365/189.01
4,975,870 12/1990  Knicely et al. .................. 364/900
5,144,314  9/1992  Malmberg et al. ................ 342/44
5,293,610  3/1994  Schwarz .......................... 395/425

*Primary Examiner*—Do Hyun Yoo
*Assistant Examiner*—Andrew Q. Tran
*Attorney, Agent, or Firm*—William J. Kubida

[57] ABSTRACT

A system and method wherein a predetermined soft fuse value may be written to a corresponding soft fuse register to control subsequent access to a number of lock bits in a non-volatile semiconductor memory array which are provided for selectively precluding writes to predetermined portions of the memory array. In a specific embodiment, the system and method may be utilized in conjunction with radio frequency ("RF") identification ("ID") transponders incorporating a non-volatile ferroelectric random access memory ("FRAM") array integrated circuit.

21 Claims, 3 Drawing Sheets

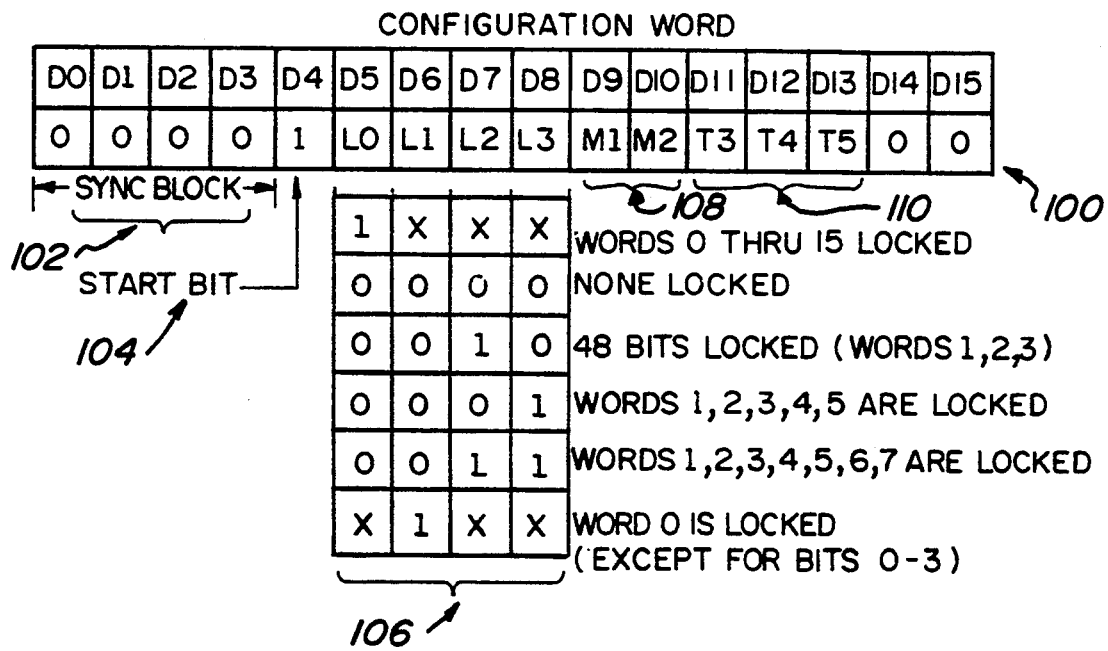
Fig_2A
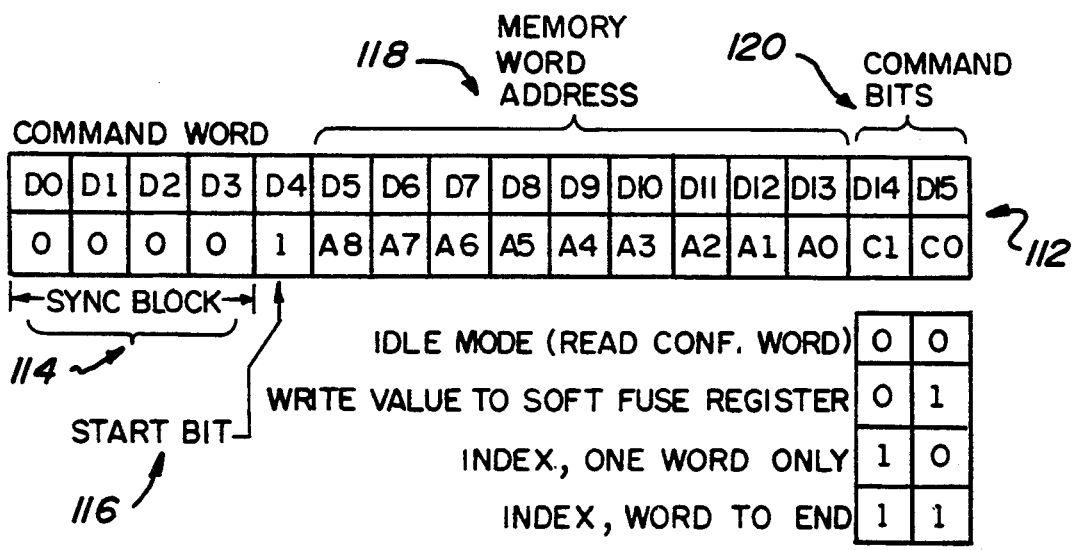
Fig_2B

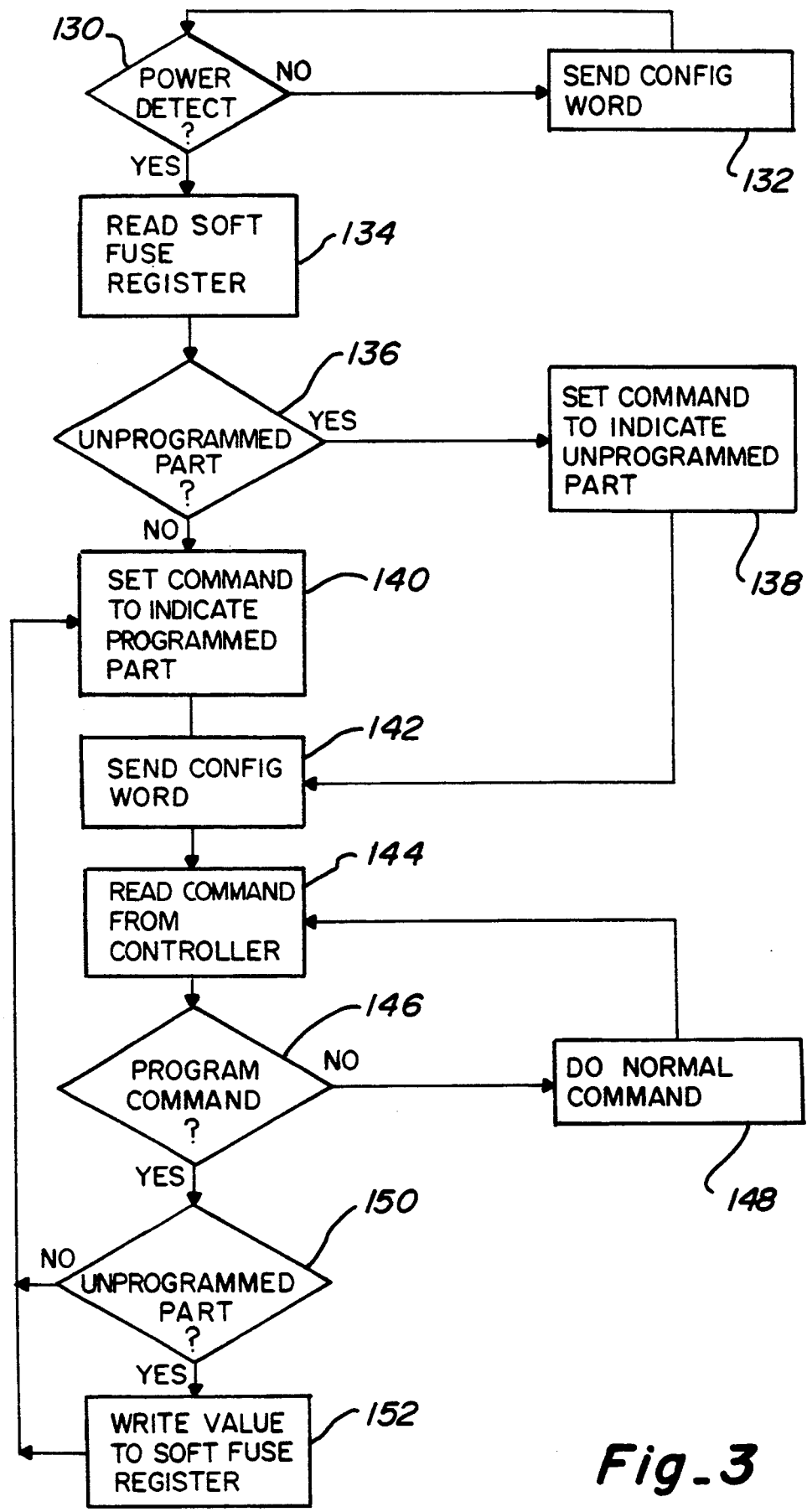
Fig_3

SYSTEM AND METHOD FOR WRITE-PROTECTING PREDETERMINED PORTIONS OF A MEMORY ARRAY

CROSS REFERENCE TO RELATED APPLICATIONS

The present invention is related to the subject matter described in U.S. patent application Ser. No. 08/194,706 entitled "INTEGRATION OF HIGH VALUE CAPACITOR WITH FERROELECTRIC MEMORY", filed Feb. 10, 1994; and assigned to the assignee of the present invention, the disclosure of which is hereby specifically incorporated by this reference.

BACKGROUND OF THE INVENTION

The present invention relates, in general, to a system and method for write-protecting predetermined portions of a memory array. More particularly, the present invention relates to a system and method wherein a predetermined soft fuse value may be written to a corresponding soft fuse register to control subsequent access to a number of lock bits in a non-volatile semiconductor memory array which are provided for selectively precluding writes to predetermined portions of the memory array. In a specific embodiment, the system and method may be utilized in conjunction with radio frequency ("RF") identification ("ID") transponders incorporating a non-volatile ferroelectric random access memory ("FRAM®") array integrated circuit available from Ramtron International Corporation at Colorado Springs, Colo. assignee of the present invention.

A possible implementation of a passive RF transponder is described in U.S. patent application Ser. No. 08/194,616 entitled "PASSIVE RF TRANSPONDER AND METHOD" and a communication system utilizing frequency shift keying ("FSK") and pulse shift keying ("PSK") modulation techniques in conjunction with a passive RF transponder is described in U.S. patent application Ser. No. 08/194,723 entitled "COMMUNICATIONS SYSTEM UTILIZING FSK/PSK MODULATION TECHNIQUES" both filed on Feb. 10, 1994 and assigned to RACOM Systems, Inc. of Englewood, Colo. RACOM Systems, Inc. manufactures and sells the RFC100 CORE reader/writer electronics module controller and the RFM256 transponder, the latter of which comprises an integrated circuit device including a 16 word (32×8 bit) FRAM memory array manufactured by Ramtron International Corporation using a proprietary lead-zirconate-titanate ("PZT") ceramic thin film process.

The non-volatile FRAM memory array of the transponder utilizes a number of lock bits to write-protect certain areas of the memory array. In this particular implementation, the lock bits are located in the first four bit positions of word 0. In operation, if specific lock bits are set, "writes" are precluded to predetermined corresponding portions of the FRAM memory array making the information contained therein essentially unchangeable. On the other hand, if specific lock bits are not set, data can be written to the same memory word bit locations repeatedly, thereby "overwriting" or changing the data. Once the lock bits have been set, they may not be "unset" thereafter to ensure the integrity of the information at the corresponding memory array bit locations.

Upon fabrication of the integrated circuit for the RFM256, the individual lock bits of the memory array (as with all other bit locations in the memory array) may randomly assume one of two different states in accordance with the known operating characteristics of FRAM memory devices. That is, they may individually assume either a logic level "one"(or "set" condition) or logic level "zero"(or "unset" condition). Prior to shipment to the end user for encapsulation or integration with other circuitry or devices, the lock bits must be cleared to a consistently "unset" state such that they may later be set as appropriate once data is written to the memory array. Currently, the integrated circuit includes a test pad which is probed during wafer test to set and unset (or "toggle") the lock bits to test their functionality and to ensure that they actually lock as well as to effectively "clear" (or unset) them prior to shipment.

However, in addition to the on chip "real estate" consumed by the test pad, the time necessary to probe the wafer adds significantly to the processing and handling time of the integrated circuit die, and hence, increases its cost. Moreover, once the die has been encapsulated, for example in an RF transponder package, the test pad is no longer accessible to allow toggling of the lock bits to alter their state or determine whether encapsulation has rendered the die inoperative.

SUMMARY OF THE INVENTION

The system and method of the present invention allows for the elimination of the memory array lock bit test pad as well as obviating a substantial portion of the wafer testing necessary to ensure that the lock bits are cleared prior to encapsulation or packaging of the integrated circuit die.

This may be effectuated by defining a first memory array location, which may be an additional non-volatile memory array word or similar grouping of memory bits constituting a soft fuse register. In the case of an unprogrammed die, this additional word would, as with the memory array itself, contain a number of bits of random data. A comparison of a known soft fuse value or "signature" to this random data at power-up is utilized to provide a signal that indicates that the part is as yet unprogrammed. A soft fuse value is a known data value that is "N" bits wide. The soft fuse value can also be thought of as a signature or password. As long as the "unprogrammed" signal remains true, the die may be considered to be new. During this mode of operation, the user is accorded access to all locations (including the lock bits) of the memory array as well as the additional word or row containing the soft fuse value as long as the soft fuse value is not written to this latter memory location. This allows the user to toggle all locations of the memory array and set the lock bits to the desired state.

Upon execution of a predefined command, the integrated circuit writes the soft fuse value or "signature" into the additional memory word location. This additional memory word now no longer contains random data, but rather contains the soft fuse value. From this point on, the "unprogrammed" signal remains false and the integrated circuit will allow only a one-time setting of the lock bits and writing to unlocked memory locations. In addition, the soft fuse value can no longer be written to the additional memory word location following the first "write". On all subsequent power-up cycles, the integrated circuit compares the contents of the additional memory word to the soft fuse value and sets the "programmed" signal appropriately.

Utilizing the system and method of the present invention, the estimated integrated circuit die yield loss due to a random occurrence of the soft fuse value appearing in the FRAM soft fuse register should be on the order of $1\frac{1}{2}2^n$, where n is the register width. As a practical matter, the "signature" value selected to be written to the soft fuse register may be carefully selected to actually lower the anticipated yield loss from the previously defined statistical average.

In operation in conjunction with an RF/ID transponder, for example, a potentially bad FRAM memory location within the integrated circuit memory array may also be flagged should the "unprogrammed" indication from the transponder be received by the controller. In this manner, the controller can also determine if the transponder is either a "new" or an already "programmed" part. Transponders indicating that they are "new" or "unprogrammed" may be flagged as having potential problems.

Specifically provided is a method for write-protecting predetermined portions of a memory array utilizing a number of lock bits settable for controlling subsequent writes to selected ones of the predetermined portions of the memory array. The method includes the steps of defining a first memory location for containing a soft fuse value and a second memory location for containing the lock bits. The contents of the first memory location are read to determine a read-out contents thereof. The read-out contents of the first memory location are compared to the soft fuse value and the setting and resetting of individual ones of the lock bits is allowed if the read-out contents do not correspond to the soft fuse value. Alternatively, setting is allowed and resetting is disallowed of individual ones of the lock bits if the read-out contents correspond to the soft fuse value.

Also provided herein is an integrated circuit and an RF transponder incorporating the same including a memory array having predetermined write-protectable portions thereof utilizing a number of lock bits settable for controlling subsequent writes to selected ones of the write-protectable portions. The memory array comprises first and second memory locations for containing a soft fuse value and the lock bits respectively. Means are provided for reading the contents of the first memory location to determine a read-out contents thereof. Additional means are provided for comparing the read-out contents of the first memory location to the soft fuse value and for allowing setting and resetting of individual ones of the lock bits if the read-out contents do not correspond to the soft fuse value. Still further, means are also provided for allowing setting, and disallowing resetting, of individual ones of the lock bits if the read-out contents correspond to the soft fuse value.

BRIEF DESCRIPTION OF THE DRAWING

The aforementioned, and other features and objects of the present invention and the manner of attaining them will become more apparent and the invention itself will be best understood by reference to the following description of a specific embodiment taken in conjunction with the accompanying drawings wherein:

FIG. 2A is a representative configuration word which may be continuously transmitted from the transponder of FIG. 1 in response to reception of sufficient RF signal strength from the associated controller to enable the non-volatile memory array and associated functional logic blocks wherein the configuration word comprises, for example, a 16 bit word including, inter alia, a number of lock bits representative of the states of the first four bits of word 0 of the memory array;

FIG. 2B is a representative command word which may be transmitted from the controller FIG. 1 to cause the transponder to read one or more words from the non-volatile memory array and transmit the same back to the controller utilizing a PSK modulated signal as well as to write a soft fuse value to a memory location to preclude further setting and resetting of the lock bits of word 0 ; and FIG. 3 is a logic flow chart of a method in accordance with the present invention utilized to read out the contents of a memory location to determine the presence or absence of the soft fuse value and allow setting and resetting of the lock bits of a memory array when the soft fuse value has not been found and to allow only the one-time setting of the lock bits once the soft fuse value has been written to the designated memory location.

DESCRIPTION OF A PREFERRED EMBODIMENT

Figure 1:
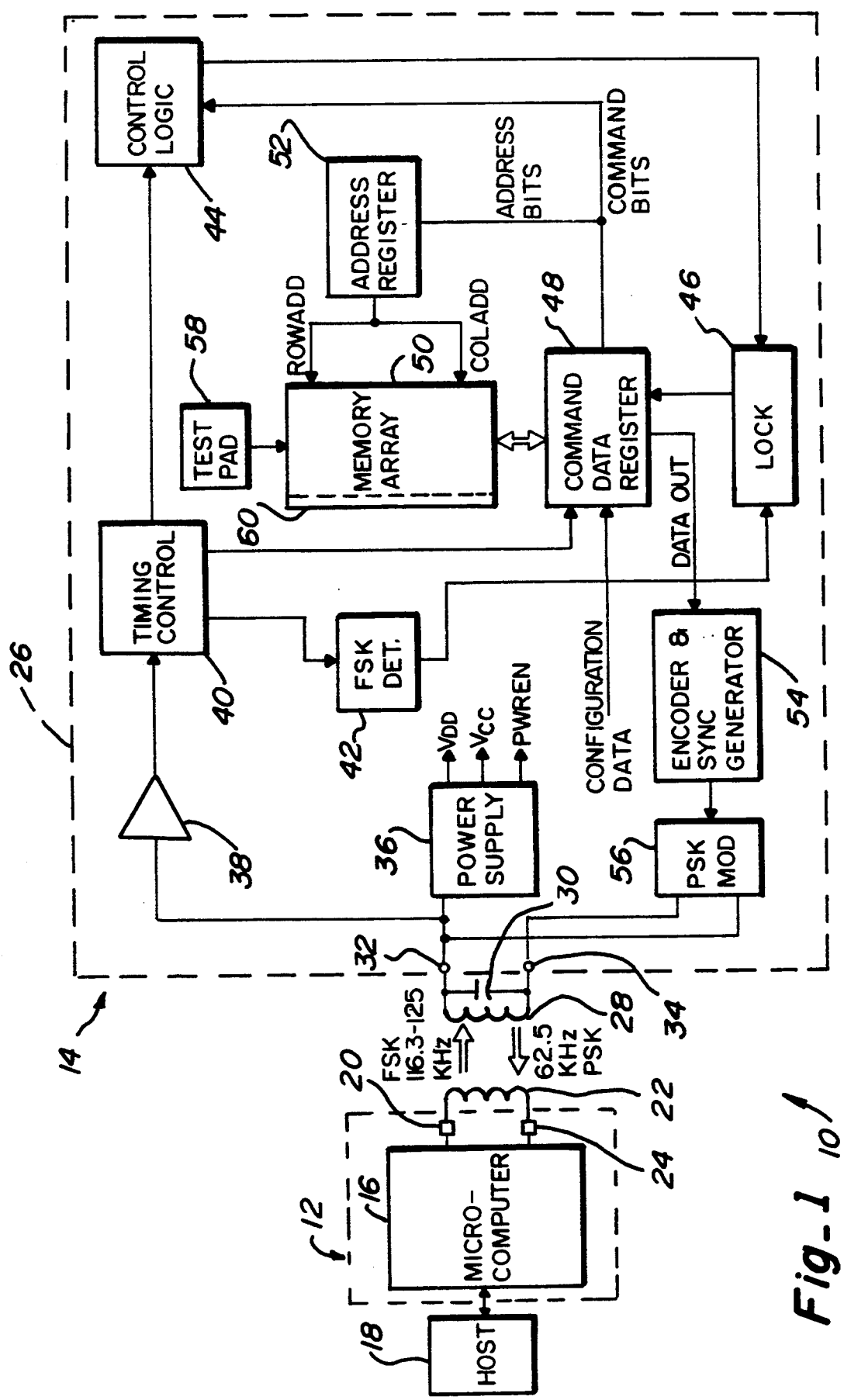
FIG. 1 is a simplified, functional block diagram of an active RF controller and associated passive RF transponder forming a communication system whereby data may be written to, or read from selected bit locations in the non-volatile memory array by means of FSK modulated command words transmitted to the transponder.

With reference now to FIG. 1, an exemplary communication system 10 to which the system and method for write-protecting predetermined portions of a memory array of the present invention may be applied, is shown. Communication system 10 comprises, in pertinent part, an active controller 12 and associated passive transponder 14. The controller 12 comprises, in pertinent part, a microcomputer 16 which may be bidirectionally coupled to a host computer 18 by means of an RS-232 port or other similar communications interface. The microcomputer 16 is coupled to an FSK output section 20 which, in turn, is coupled to an antenna 22 for broadcasting an FSK modulated digital signal varying between 116.3 and 125 KHz. Antenna 22 is also utilized for reception of a PSK modulated signal of 62.5 KHz transmitted by the transponder 14 in response to the powering FSK signal received from the controller 12. The microcomputer 16 is coupled to a PSK input section 24 for reception of the data transmitted from the transponder 14 as received by the antenna. 22.

Transponder 14 comprises an integrated circuit 26 as well as an externally connected antenna coil 28 and parallel connected tuning capacitor 30. The parallel combination of antenna coil 28 and tuning capacitor 30 is coupled to the integrated circuit 26 at RF+ node 32 and RF− node 34. Power for the integrated circuit 26 of the transponder 14 is derived from the RF signal transmitted from the controller 12 by means of power supply 36 coupled across RF+ node 32 and RF− node 34. In this manner, when the transponder 14 is sufficiently within the powering RF field of the controller 12, power supply 36 can provide a source of $V_{DD}$, $V_{SS}$ and PWREN as shown.

The FSK modulated RF signal received by antenna coil 28 and tuning capacitor 30 is also supplied through amplifier 38 to a timing control circuit 40 for synchronizing operation of the various logic blocks of the transponder 14. Timing control circuit 40 supplies inputs to FSK detector circuit 42, control logic 44 and command data register 48. Output of FSK detector circuit 42 is supplied as one input to lock control circuit 46 which has an output coupled to the command data register 48. Lock control circuit 46 also receives as input, an output of control logic 44. An additional input to the command data register 48 is supplied as configuration data which may be "hard-wired" or pre-set during the manufacture of the integrated circuit 26 of the transponder 14.

The command data register 48 supplies inputs to address register 52 and control logic 44 to provide signals indicative of the address bits and command bits respectively derived from the controller 12 command word as will be more fully described hereinafter. The address register 52 provides a row address ("ROWADD") and column address ("COLADD") input to memory array 50 to select desired memory locations. Memory array 50 is bidirectionally coupled by means of a data bus to the command data register 48 such that information may be written to or read from the memory array 50 in accordance with the contents of the current contents of the command data register and the signals from the address register 52. The contents of the command data register 48 is also supplied as a data out signal to an encoder and synchronization generator 54 which has its output coupled to a PSK modulator 56. The output of the PSK modulator 56 is supplied across RF+ node 32 and RF− node 34 to generate a PSK encoded RF signal for transmission from the transponder 14 to the controller 12.

Memory array 50 has an associated test pad 58 to allow, inter alia, the setting and resetting of the lock bits which, in this particular implementation, comprise the first four bit locations of word 0 of the memory array 50. In accordance with the present invention, an additional memory word, or register, may be associated with, or part of, the memory array 50 to constitute a soft fuse register 60 for implementing the system and method of the present invention as will be more fully described hereinafter.

In operation, the communication system 10 utilizes FSK modulated RF signals transmitted from the controller 12 to the transponder 14 from which the latter derives its power as previously described. The use of FSK modulation allows the average signal power to remain at a maximum as opposed to other modulation techniques and the transponder 14 is able to demodulate the FSK encoded signal without the incorporation of an on-chip oscillator frequency reference.

Upon power-up by introduction of the transponder 14 to the electromagnetic field of the associated controller 12, the transponder 14 continuously transmits a configuration word to the controller 12 utilizing a phase coherent PSK modulated signal of 62.5 KHz which is derived from the 125 KHz FSK RF input. An exemplary configuration word 100 is shown in FIG. 2A.

With reference additionally to FIG. 2A, the configuration word 100 comprises 16 bits of data designated as bits D0–D15. Bits D0–D3 are denominated as a synchronization block 102 which generally comprises four consecutive logic level "zeros". Bit D4 is denominated a start bit 104 and generally comprises a single bit of logic level "one".

Following the synchronization block 102 and start bit 104, bits D5–D8 comprise a number of lock bits 106 designated L0–L3. Lock bits 106 may be followed by a number of mask bits 108 and type bits 110 as well as two bits D14 and D15 which correspond to the command bits of a command word transmitted by the controller 12 to the transponder 14. Bits D14 and D15 may be utilized to indicate the state of the soft fuse register 60 to the associated controller 12.

The lock bits 106 control access to writes initiated by the controller 12 to predetermined locations of the memory array 50 of the transponder 14. As an example only, if bit L0 is set to a logic level "one", words 0 through 15 (and, hence, the entire memory array 50) are locked and thus the contents of the memory array 50 may not be altered. Conversely, if all of the lock bits 106 L0–L3 are logic level "zero", none of the words of the memory array 50 are precluded from being written to by the receipt of the appropriate command from the controller 12. If bit L2 of the lock bits 106 is a logic level "one" and the remaining lock bits are logic level "zero", words 1 through 3 of the memory array 50 are locked. If bit L3 of the lock bits 106 is a logic level "one" and the remaining lock bits are logic level "zero", words 1 through 5 are locked. In like manner, if bits L2 and L3 of the lock bits 106 are logic level "one" and the remaining lock bits are logic level "zero", words 1 through 7 are locked. Finally, if bit L1 of the lock bits 106 is a logic level "one" word 0 of the memory array 50 is locked except for the first four bit locations 0 through 3 which contain the actual lock bits corresponding to the lock bits 106 of the configuration word 100.

Referring additionally now to FIG. 2B, the controller 12 modulates a data signal between 125 KHz and 116.3 KHz to send a four bit time synchronization block 114, a start bit 116, a memory word address 118 and command bits 120 together comprising a 16 bit command word 112 comprising bits D0–D15. The synchronization block 114 and start bit 116 correspond directly with the synchronization block 102 and start bit 104 of the configuration word 100 transmitted by the transponder 14. When synchronization between these portions of the configuration word 100 and the command word 112 is achieved, the bits of the memory word address 118 designates to the transponder 14 the word location within the memory array 50 from which data is to be read, or to which data is to be written. The two command bits 120 control the operation of the transponder 14 in accordance with the finite state machine of the control logic 44.

As an example, when in the idle mode, the command bits C1 and C0 are both at logic level "zero" whereupon the transponder 14 will continuously transmit the configuration word 100 to the associated controller 12. By setting bit C1 to a logic level "one" and bit C0 to logic level "zero", the transponder 14 will read the data from the corresponding word of the memory array 50 and transmit the same back to the associated controller 12. If the controller 12 changes the data at the word denominated by the memory word address 118, it simultaneously transmits complementary bit signals of 116.3 KHz in bit-for-bit synchronization with the data being transmitted from the transponder 14. In like manner, if the command bit C1 is a logic level "one" and the command bit C0 is also a logic level "one", the transponder will begin transmitting the contents of the memory array 50 beginning at the memory word address 118 specified through and including word 15. As before, should the controller wish to alter the contents of the memory array 50, it will transmit 116.3 KHz signals in synchronization with the data being transmitted from the transponder 14.

The command bits 120 may also be utilized in accordance with the present invention to write a predetermined soft fuse value to the soft fuse register 60 by setting bit C1 to a logic level "zero" and bit C0 to a logic level "one". In this manner, and as will be more fully described hereinafter, the integrated circuit 26 of the transponder 14 will be recognized as either a "programmed" (i.e., the predetermined soft fuse value has been written to the soft fuse register 60) or "unprogrammed" (i.e., the soft fuse value has not yet been written to the soft fuse register 60) unit.

With reference additionally now to FIG. 3, a logic flow chart for the system and method of the present invention is shown. The logic flow begins at decision step 130 whereupon, if sufficient power is being supplied to the integrated circuit 26 of the transponder 14 by the power supply 36, the process proceeds to step 134 where the contents of the soft fuse register 60 are read. Alternatively, if the transponder 14 is not powered sufficiently to be fully operational, but still sufficiently powered to enable transmission of the configuration word 100, the process proceeds to step 132 where the configuration word 100 is continuously transmitted to the associated controller 12.

From step 134, the process proceeds to decision step 136 where it is determined whether or not the integrated circuit 26 is an unprogrammed part. At step 138, if the integrated circuit 26 is an unprogrammed part, the bits D14 and D15 of the configuration word 100 are set to a predefined state to indicate to the controller 12 that it is an unprogrammed part and the configuration word 100 is sent to the controller 12 at step 142. Conversely, if it is determined at decision step 140 that the integrated circuit 26 is not an unprogrammed part, then, at step 140, the final two bits of the configuration word 100 are set to a different predefined state to indicate to the controller 12 that it is an already programmed part and the configuration word 100 is sent at step 142. Briefly then, by means of steps 138 and 140, the transponder 14 serves to indicate by the setting of bits D14 and D15 of the configuration word 100 whether or not it is a programmed or unprogrammed part.

At step 144, the transponder 14 reads the command bits 120 from the command word 112 and the process proceeds to decision step 146. If at decision step 146, the "program" command (01) is not found, then at step 148 the normal command designated by the command bits 120 of the command word 112 is executed. However, if at step 146 the "program" command is recognized, then the process proceeds to decision step 150 where, if the integrated circuit 26 of the transponder 14 is not an unprogrammed part (i.e. is a programmed part), the process returns to step 140 to set bits D14 and D15 of the configuration word 100 to indicate that it is already a programmed part. Alternatively, if at decision step 150 it is determined that the integrated circuit 26 of the transponder 14 is an unprogrammed part, then the process proceeds to step 152 where the predetermined soft fuse value is written to the soft fuse register 60 associated with the memory array 50. The process then proceeds to step 140 to indicate that the integrated circuit 26 of the transponder 14 is now a programmed part inasmuch as the predetermined soft fuse value, or "signature", has been written to the soft fuse register 60.

While there have been described above the principles of the invention in conjunction with specific apparatus, it is to be clearly understood that the foregoing description is made only by way of example and not as a limitation to the scope of the invention. Particularly, while having been described with respect to an exemplary implementation in conjunction with a FRAM memory array and an RF/ID communications system, the system and method of the present invention is nevertheless applicable to use in conjunction with any type of non-volatile memory devices including non-volatile RAMs ("NVRAMs"), static RAMs ("SRAMs"), battery backed SRAMs ("BBSRAMs"), electrically erasable programmable read only memories ("EEPROMs") and the like.

What is claimed is:

1. A method for write-protecting predetermined portions of a memory array utilizing a number of lock bits settable for controlling subsequent writes to selected ones of said predetermined portions of said memory array, said method comprising the steps of:
    defining a first memory location for containing a known value forming a soft fuse value and a second memory location for containing said lock bits;
    reading the contents of said first memory location to determine a read-out contents thereof;
    comparing said read-out contents of said first memory location to said soft fuse value;
    allowing setting and resetting of individual ones of said lock bits if said read-out contents do not correspond to said soft fuse value; and
    allowing setting and disallowing resetting of individual ones of said lock bits if said read-out contents correspond to said soft fuse value.

2. The method of claim 1 wherein said step of defining comprises the step of partitioning said first and second memory locations within said memory array.

3. The method of claim 1 wherein said step of defining comprises the step of providing an additional memory word of said memory array as said first memory location.

4. The method of claim 1 wherein said step of defining is carried out by means of a non-volatile storage device.

5. The method of claim 4 wherein said non-volatile storage device comprises a ferroelectric random access memory integrated circuit.

6. The method of claim 1 further comprising the step of:
    writing said soft fuse value to said first memory location prior to said step of reading.

7. The method of claim 1 further comprising the step of:
    indicating to an external device whether said first memory location contains said soft fuse value.

8. An integrated circuit including a memory array having predetermined write-protectable portions thereof utilizing a number of lock bits settable for controlling subsequent writes to selected ones of said write-protectable portions, said memory array comprising:
    first and second memory locations for containing a known value forming a soft fuse value and said lock bits respectively;
    means, coupled to said first memory location, for comparing; coupled to said first memory location, for reading the contents of said first memory location to determine a read-out contents thereof;
    means, coupled to receive said soft fuse value and said read-out contents, for comparing said read-out contents of said first memory location to said soft fuse value;

means, coupled to said second memory location and responsive to said means for comparing, for allowing setting and resetting of individual ones of said lock bits if said read-out contents do not correspond to said soft fuse value; and means, coupled to said second memory location and resposive to said means for comparing for allowing setting and disallowing resetting of individual ones of said lock bits if said read-out contents correspond to said soft fuse value.

9. The integrated circuit of claim 8 wherein said memory array comprises a non-volatile memory array.

10. The integrated circuit of claim 9 wherein said memory array comprises a ferroelectric memory array.

11. The integrated circuit of claim 10 wherein said first and second memory locations comprise a portion of said ferroelectric memory array.

12. The integrated circuit of claim 8 further comprising:

means for writing said soft fuse value to said first memory location in response to an external device.

13. The integrated circuit of claim 12 further comprising:

means for indicating to said external device whether said first memory location contains said soft fuse value.

14. An RF transponder including a memory array having predetermined write-protectable portions thereof utilizing a number of lock bits settable for controlling subsequent writes to selected ones of said write-protectable portions, said memory array comprising:

first and second memory locations for containing a known value forming a soft fuse value and said lock bits respectively;

means, coupled to said first memory location, for reading the contents of said first memory location to determine a read-out contents thereof;

means, coupled to receive said soft fuse value and said read-out contents, for comparing said read-out contents of said first memory location to said soft fuse value;

means, coupled to said second memory location and responsive to said means for comparing, for allowing setting and resetting of individual ones of said lock bits if said read-out contents do not correspond to said soft fuse value; and means, coupled to said second memory location and responsive to said means for comparing, for allowing setting and disallowing resetting of individual ones of said lock bits if said read-out contents correspond to said soft fuse value.

15. The RF transponder of claim 14 wherein said memory array comprises a non-volatile memory array.

16. The RF transponder of claim 15 wherein said memory array comprises a ferroelectric memory array.

17. The RF transponder of claim 16 wherein said first and second memory locations comprise a portion of said ferroelectric memory array.

18. The RF transponder of claim 14 further comprising:

means for writing said soft fuse value to said first memory location in response to an external device.

19. The RF transponder of claim 18 further comprising:

means for indicating to said external device whether said first memory location contains said soft fuse value.

20. The RF transponder of claim 19 wherein said external device is an RF controller.

21. The RF transponder of claim 20 wherein said means for indicating comprises a number of bits transmitted to said RF controller indicative of said soft fuse value being present or not present in said first memory location.

* * * * *